United States Patent
Shin

(10) Patent No.: US 8,395,934 B2
(45) Date of Patent: Mar. 12, 2013

(54) PHASE-CHANGE MEMORY DEVICE

(75) Inventor: Yoon Jae Shin, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 146 days.

(21) Appl. No.: 12/828,122

(22) Filed: Jun. 30, 2010

(65) Prior Publication Data

US 2011/0292719 A1 Dec. 1, 2011

(30) Foreign Application Priority Data

May 27, 2010 (KR) .................. 10-2010-0049658

(51) Int. Cl.
*G11C 11/21* (2006.01)

(52) U.S. Cl. ...................................... 365/163

(58) Field of Classification Search ................ None
See application file for complete search history.

(56) References Cited

U.S. PATENT DOCUMENTS

2008/0055972 A1* 3/2008 Oh et al. ................ 365/163
2009/0097336 A1* 4/2009 Kang et al. ............ 365/189.14

FOREIGN PATENT DOCUMENTS

KR 1019990065445 A 8/1999
KR 100929304 B1 11/2009

* cited by examiner

*Primary Examiner* — Hoai V Ho
*Assistant Examiner* — James G Norman

(57) ABSTRACT

A phase-change memory device includes: a cell array including at least one unit cell; a current sensing unit sensing data stored in the at least one unit cell; and a power generation circuit supplying a power source voltage to the current sensing unit, in which the power generation circuit is activated while the current sensing unit is performing a sensing operation.

24 Claims, 10 Drawing Sheets

PHASE-CHANGE MEMORY DEVICE

CROSS-REFERENCES TO RELATED APPLICATIONS

The present application claims priority to Korean patent application number 10-2010-0049658, filed on 27 May 2010, which is incorporated by reference in its entirety.

BACKGROUND OF THE INVENTION

The present invention relates to a phase-change memory device.

Phase-change memory devices have a nonvolatile characteristic, and thus maintain data stored therein even when not powered. Furthermore, although they are nonvolatile memory devices, the phase-change memory devices have a data processing speed of a random access memory (RAM) device that is a volatile memory device.

FIG. 1a and FIG. 1b are views illustrating a phase-change resistor 4 included in a phase-change memory device. Referring to FIG. 1a and FIG. 1b, the phase-change resistor 4 is composed of an upper electrode 1, a lower electrode 3, and a phase-change material 2 sandwiched between the upper electrode 1 and the lower electrode 3. When applying a voltage to the upper electrode 1 and the lower electrode 3, electric current flows through the phase-change material 2 to vary a temperature thereof, and thus an electric conductive state thereof changes.

FIG. 2a and FIG. 2b are views illustrating a data storage principle of the phase-change resistor 4. If an electric current less than a threshold value flows through the phase-change resistor 4, the phase-change material 2 is crystallized. When the phase-change material 2 is crystallized, it becomes a material having low resistance. As a result, an electric current can flow between the upper electrode 1 and the lower electrode 3.

Meanwhile, referring to FIG. 2b, if an electric current equal to or greater than the threshold value flows through the phase-change resistor 4, the phase-change material 2 has a temperature greater than a melting point thereof. When the phase-change material 2 melts to become an amorphous phase, it becomes a material having high resistance. As a result, it is difficult for an electric current to flow between the upper electrode 1 and the lower electrode 3.

Accordingly, the phase-change resistor 4 may store two different data corresponding to the forgoing two states. For example, the phase-change resistor 4 can use a low resistance state to represent data of a logical '1' and a high resistance state to represent data of a logical '0'. Furthermore, because the state of the phase-change material 2 does not vary even when the phase-change memory device is not powered, the data can be stored in a nonvolatile pattern.

FIG. 3 is a graph illustrating a write operation of a phase-change resistive cell including the phase-change resistor 4. Referring to FIG. 3, when an electric current flows between the upper electrode 1 and the lower electrode 3 of the phase-change resistor 4 for a predetermined time, heat is generated. When an electric current less than a threshold value flows for a predetermined time, the phase-change material 2 is crystallized under a low temperature heating condition. Consequently, the phase-change resistor 4 becomes a set state.

Conversely, when an electric current equal to or greater than the threshold value flows through the phase-change resistor 4, the phase-change material 2 becomes an amorphous state under a high temperature heating condition. As a result, the phase-change resistor 4 becomes a reset state.

To write the set state in the write operation through the use of the above features, a low voltage is applied to the phase-change resistor 4 for a long time.

Conversely, to write the reset state in the write operation, a high voltage is applied to the phase-change resistor 4 for a short time.

Meanwhile, during a sensing operation, a sensing current is provided to the phase-change resistor 4, thereby sensing data stored in the phase-change resistor 4.

In a sensing circuit of the phase-change memory device, a power source voltage is required to generate the sensing current.

In general, since a power supply circuit supplying the power source voltage into the nonvolatile phase-change memory device supplies the power source voltage regardless of the activation of the sensing operation, power consumption increases.

Furthermore, in the conventional phase-change memory device, if a surrounding temperature of an internal circuit varies, the timing of the power source voltage supplied also varies.

Since, however, the conventional phase-change memory device controls internal control signals regardless of the temperature variation, if the surrounding temperature varies, a delay may occur in the operational timing of the internal control signals.

BRIEF SUMMARY OF THE INVENTION

Embodiments of the present invention are directed to a phase-change memory device that may prevent a power source voltage from being supplied to a sensing circuit while a sensing operation is not performed.

Embodiments of the present invention are also directed to a phase-change memory device capable of reducing a delay occurring due to temperature variation by controlling internal circuits according to a control signal corresponding to the temperature variation.

According to an embodiment of the present invention, a phase-change memory device includes: a cell array including one or more unit cell; a current sensing unit sensing data stored in the unit cell; and a power generation circuit supplying a power source voltage to the current sensing unit, wherein the power generation circuit is activated while the current sensing unit is performing a sensing operation.

The present invention reduces power consumption by preventing the power source voltage from being supplied to the sensing circuit while a sensing operation is not performed.

In addition, the present invention has an effect that it may reduce a delay occurring due to temperature variation by controlling internal circuits of a phase-change memory device according to a control signal corresponding to the temperature variation.

DESCRIPTION OF EMBODIMENTS

Embodiments of the present invention are described with reference to the accompanying drawings in detail.

Figure 1A:
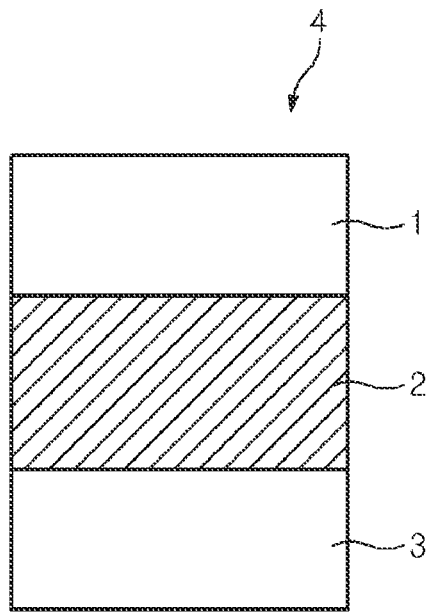
FIG. 1a and FIG. 1b are views illustrating a phase-change resistor.
Figure 1B:
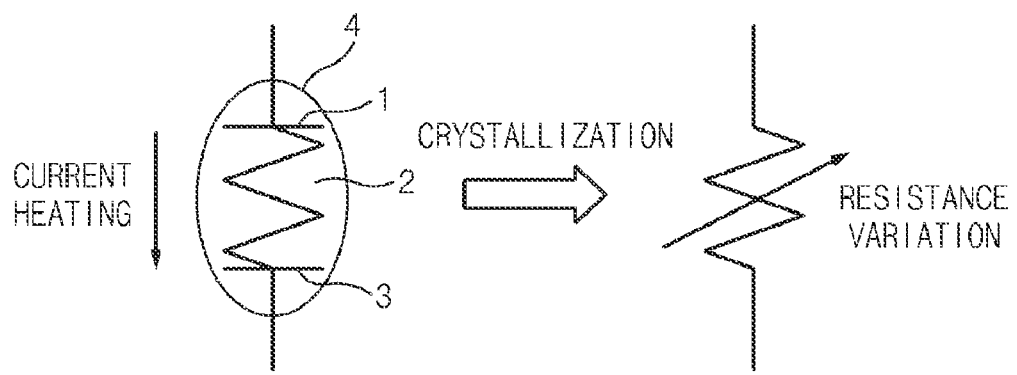
Figure 2A:
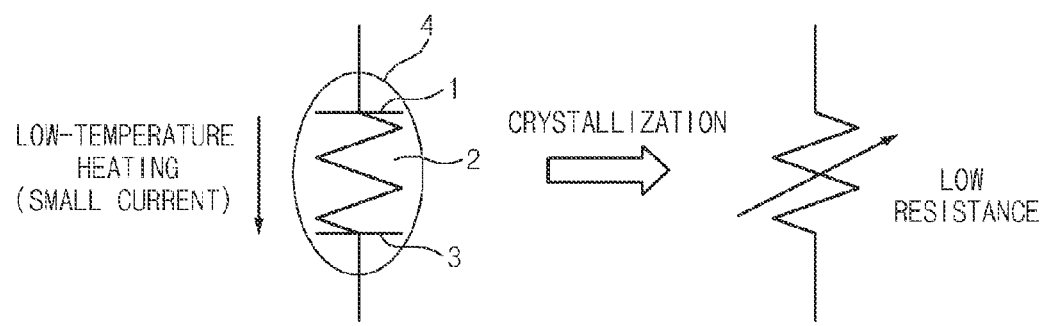
FIG. 2a and FIG. 2b are views illustrating a data storage principle of the phase-change resistor shown in FIGS. 1a and 1b.
Figure 2B:
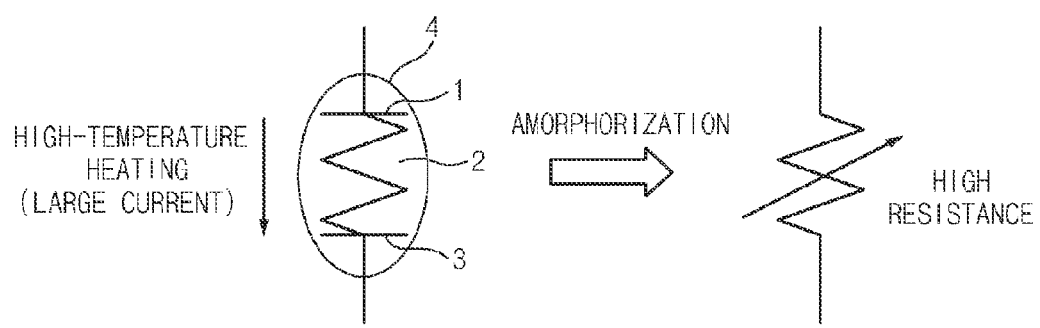
Figure 3:
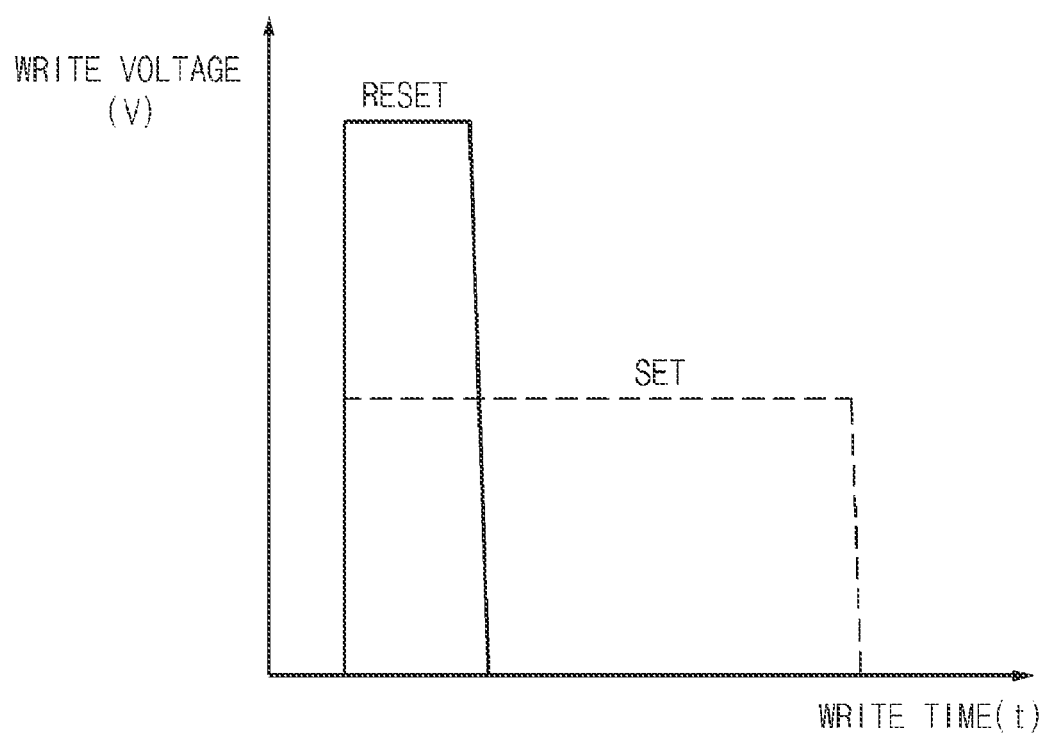
FIG. 3 is a graph illustrating a write operation of a phase-change resistive cell.
Figure 4:
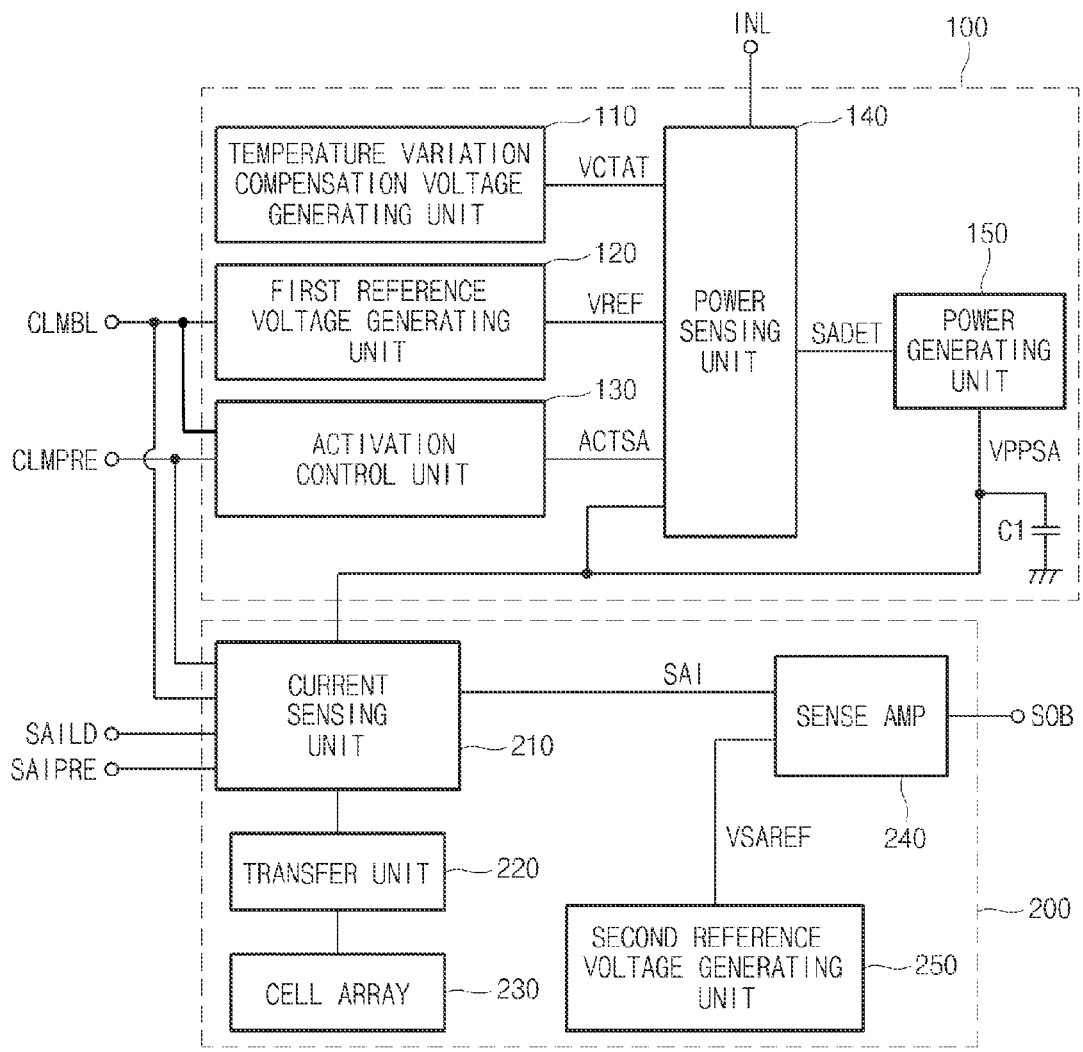
FIG. 4 is a block diagram illustrating a phase-change memory device according to an embodiment of the present invention.

FIG. 4 is a block diagram illustrating a phase-change memory device according to an embodiment of the present invention. Referring to FIG. 4, the phase-change memory device includes a power generation circuit 100 and an internal circuit 200.

The power generation circuit 100 generates a power source voltage VPPSA and supplies it to the internal circuit 200. The power generation circuit 100 receives the power source voltage VPPSA fed back from an output node thereof to thereby constantly maintain a level of the power source voltage VPPSA.

The internal circuit 200 may include various circuits used in the phase-change memory device. This embodiment of the present invention illustrates a sensing circuit 200 for sensing data stored in a unit cell UC included in a cell array 230.

The power generation circuit 100 includes a temperature variation compensation voltage generating unit 110, a first reference voltage generating unit 120, an activation control unit 130, a power sensing unit 140, a power generating unit 150, and a charge storage element C1.

The temperature variation compensation voltage generating unit 110 generates a temperature compensation control voltage VCTAT, which varies according to temperature variation. For example, as a temperature increases, the temperature compensation control voltage VCTAT can be configured to decrease. Conversely, as the temperature increases, the temperature compensation control voltage VCTAT can be configured to increase. The temperature variation compensation voltage generating unit 110 outputs the temperature compensation control voltage VCTAT to the power sensing unit 140.

The first reference voltage generating unit 120 generates a first reference voltage VREF. Assuming that the temperature is constant, the power generation circuit 100 should maintain a level of the power source voltage VPPSA constantly since the internal circuit 200 cannot stably operate if the level of the power source voltage VPPSA is unstable. The first reference voltage VREF represents a reference voltage for allowing the power generation circuit 100 to maintain a constant power source voltage VPPSA.

The activation control unit 130 outputs an activation signal ACTSA to control an operation of the power sensing unit 140. The activation control unit 130 generates the activation signal ACTSA according to a first clamping control signal CLMPRE and a second clamping control signal CLMBL.

If the activation signal ACTSA is enabled, the power sensing unit 140 starts its operation. If the activation signal ACTSA is disabled, the power sensing unit 140 completes its operation. The first clamping control signal CLMPRE and the second clamping control signal CLMBL are signals for controlling the starting and completion of a sensing operation performed in the sensing circuit 200, respectively, wherein the sensing operation of the sensing circuit 200 will be described below.

According to this embodiment of the present invention, the phase-change memory device controls an operation of the power generation circuit 100 using signals for controlling the starting and completion of the sensing operation. In this case, while the sensing circuit 200 performs the sensing operation, the power generation circuit 100 supplies the power source voltage VPPSA to the sensing circuit 200. Conversely, while the sensing circuit 200 does not perform the sensing operation, the power generation circuit 100 does not supply the power source voltage VPPSA to the sensing circuit 200.

The power sensing unit 140 differentially amplifies the power source voltage VPPSA and the first reference voltage VREF to generate a power control signal SADET. For example, if a level of the power source voltage VPPSA is maintained constant, there is a small voltage difference between the power source voltage VPPSA and the first reference voltage VREF, and thus a differentially amplified amount becomes small. As a result, a voltage level of the power control signal SADET is also low.

Meanwhile, if the level of the power source voltage VPPSA is rapidly increased or reduced, a large voltage difference occurs between the power source voltage VPPSA and the first reference voltage VREF. Namely, because the differentially amplified amount becomes large, the voltage level of the power control signal SADET becomes high.

The power generating unit 150 may control its driving force of generating the power source voltage VPPSA according to the voltage level of the power control signal SADET to thereby control the voltage level of the power source voltage VPPSA.

The power sensing unit 140 receives the temperature compensation control voltage VCTAT and prevents the activation and deactivation timing of the power source voltage VPPSA from being changed according to the temperature variation. The temperature compensation control voltage VCTAT has a voltage level varying according to the temperature variation. For example, as the temperature increases, the voltage level of the temperature compensation control voltage VCTAT may be lowered.

The activation and deactivation timing of the power control signal SADET generated by the power sensing unit 140 is affected by the temperature. Referring to only the block diagram of FIG. 4, the activation and deactivation timing of the power control signal SADET are determined according to the voltage levels of the power source voltage VPPSA and the first reference voltage VREF. However, in a real situation, operation characteristics of circuit elements may change according to the temperature variation. Accordingly, compared with a temperature under a normal condition, if the temperature decreases or increases, a delay may occur in the activation and deactivation timing of the power control signal SADET.

Since the power sensing unit 140 of the phase-change memory device according to this embodiment of the present invention controls its differential amplification operation according to the temperature compensation control voltage VCTAT, the foregoing delay may be minimized. The power sensing unit 140 is activated or deactivated according to the activation signal ACTSA.

For example, if the activation signal ACTSA is enabled, the power sensing unit 140 starts its operation. On the other hand, if the activation signal ACTSA is disabled, the power sensing unit 140 completes its operation.

The power generating unit 150 drives the power control signal SADET to generate the power source voltage VPPSA. The power generating unit 150 may include a plurality of drivers.

The charge storage element C1 may be connected between an output terminal of the power generating unit 150 and a ground voltage terminal. The charge storage element C1 may include a capacitor. The charge storage element C1 serves to store a charge corresponding to the power source voltage VPPSA and to transfer the power source voltage VPPSA to the sensing unit 200.

The sensing circuit 200 includes a current sensing unit 210, a transfer unit 220, the cell array 230, a sense amplifier 240, and a second reference voltage generating unit 250.

The current sensing unit 210 receives the power source voltage VPPSA from the power generation circuit 100. The current sensing unit 210 drives the power source voltage VPPSA to produce a sensing current. The current sensing unit 210 provides the sensing current to the cell array 230 through the transfer unit 220, produces a sensing voltage SAI corresponding to a resistance state of a phase-change resistor PCR included in a unit cell UC of the cell array 230, and outputs the sensing voltage SAI to the sense amplifier 240.

It is assumed that the current sensing unit 210 provides the sensing current to the phase-change resistor PCR included in the unit cell UC of the cell array 230. When the phase-change resistor PCR is in a high resistance state, the sensing voltage SAI is determined according to the sensing current and a resistance value of the phase-change resistor PCR corresponding to the high resistance state. In this case, the sensing voltage SAI has a high voltage level. When the phase-change resistor PCR is in a low resistance state, the sensing voltage SAI is determined according to the sensing current and a resistance value corresponding to the low resistance state. In this case, the sensing voltage SAI has a low voltage level.

The second reference voltage generating unit 250 generates a second reference voltage VSAREF. The second reference voltage VSAREF is a reference voltage used to discriminate which data corresponds to the sensing voltage SAI. For example, the second reference voltage VSAREF may be an intermediate value of a sensing voltage SAI corresponding to the high resistance state and a sensing voltage SAI corresponding to the low resistance state.

The sense amplifier 240 receives the sensing voltage SAI from the current sensing unit 210 and the second reference voltage VSAREF from the second reference voltage generating unit 250. The sense amplifier 240 compares the sensing voltage SAI with the second reference voltage VSAREF to output sensing data SOB. The sense amplifier 240 outputs the sensing data SOB to other circuits in the phase-change memory device.

For example, if the sensing voltage SAI is greater than the second reference voltage VSAREF, the sense amplifier 240 outputs the sensing data SOB corresponding to data of logical "0". On the other hand, if the sensing voltage SAI is lower than the second reference voltage VSAREF, the sense amplifier 240 outputs the sensing data SOB corresponding to data of logical "1".

In the meantime, the current sensing unit 210 receives the first clamping control signal CLMPRE, the second clamping control signal CLMBL, a current drive signal SAILD, and a current precharge signal SAIPRE, which in turn controls operation timing of the current sensing unit 210.

The cell array 230 includes at least one unit cell UC. When performing a sensing operation with respect to the at least one unit cell UC, a sensing operation with respect to a specific unit cell UC can be selectively performed. The transfer unit 220 electrically connects the cell array 230 to the current sensing unit 210. The transfer unit 220 can control a sensing current to be supplied to only a specific unit cell UC.

In the cell array 230, each unit cell UC may include a phase-change resistor PCR and a switching element. For example, the switching element may be a diode D.

Figure 5:
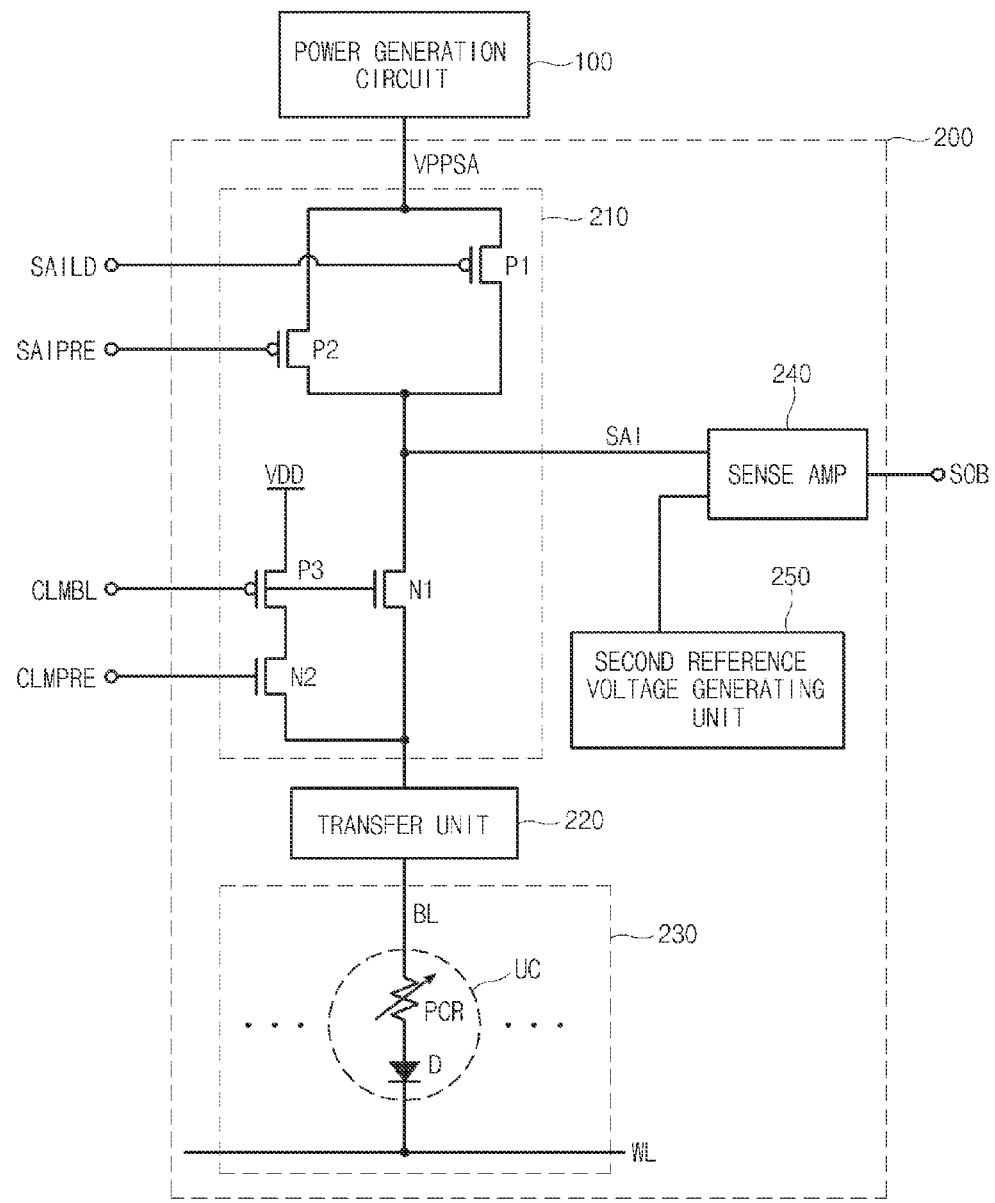
FIG. 5 is a block diagram illustrating a sensing circuit of the phase-change memory device according to an embodiment of the present invention.

FIG. 5 is a block diagram illustrating the sensing circuit 200 of the phase-change memory device according to an embodiment of the present invention.

Referring to FIG. 5, the sensing circuit 200 according to this embodiment includes the current sensing unit 210, the transfer unit 220, the cell array 230, the sense amplifier 240, and the second reference voltage generating unit 250. The sensing unit 200 receives the power source voltage VPPSA from the power generation circuit 100.

The current sensing unit 210 senses data stored in a unit cell UC of the cell array 230 using the power source voltage VPPSA. The current sensing unit 210 receives the current drive signal SAILD, the current precharge signal SAIPRE, the first clamping control signal CLMPRE, and the second clamping control signal CLMBL. A sensing operation of the current sensing unit 210 is controlled according to the foregoing signals.

The current sensing unit 210 includes a first PMOS transistor P1, a second PMOS transistor P2, a third PMOS transistor P3, a first NMOS transistor N1, and a second NMOS transistor N2.

A source of the first PMOS transistor P1 is connected with an output terminal of the power generation circuit 100, and the power source voltage VPPSA is supplied to the source. The current drive signal SAILD is input to a gate of the first PMOS transistor P1. A drain of the first PMOS transistor P1 is connected with an output terminal of the current sensing unit 210 and a drain of the first NMOS transistor N1.

A source of the second PMOS transistor P2 is connected with the output terminal of the power generation circuit 100, and the power source voltage VPPSA is supplied to the source. The current precharge signal SAIPRE is input to a gate of the second PMOS transistor P2. A drain of the second PMOS transistor P2 is connected with the output terminal of the current sensing unit 210 and the drain of the first NMOS transistor N1.

The power source voltage VPPSA is supplied to the sources of the first PMOS transistor P1 and the second PMOS transistor P2, and thus the first PMOS transistor P1 and the second PMOS transistor P2 drive and transfer the power source voltage VPPSA to the drain of the first NMOS transistor N1, i.e., the output terminal of the current sensing unit 210.

As described above, the drain of the first NMOS transistor N1 is connected with the output terminal of the current sensing unit 210 and the drains of the first PMOS transistor P1 and the second PMOS transistor P2. The second clamping control signal CLMBL is input to a gate of the first NMOS transistor N1. A source of the first NMOS transistor N1 is connected with the transfer unit 220.

The first NMOS transistor N1 transfers the power source voltage VPPSA driven by the first PMOS transistor P1 and the second PMOS transistor P2 to the transfer unit 220 according to the second clamping control signal CLMBL.

A power source voltage VDD is supplied to a source of the third PMOS transistor P3, and the second clamping control signal CLMBL is input to a gate thereof. A drain of the third PMOS transistor P3 is connected with a drain of the second NMOS transistor N2.

The drain of the second NMOS transistor N2 is connected with the drain of the third PMOS transistor P3. The first clamping control signal CLMPRE is input to a gate of the second NMOS transistor N2. A source of the second NMOS transistor N2 is connected with the transfer unit 220. The third PMOS transistor P3 and the second NMOS transistor N2 serve to transfer the power source voltage VDD to the transfer unit 220 according to the second clamping control signal CLMBL and the first clamping control signal CLMPRE, respectively.

The transfer unit 220 serves to transfer the power source voltage VPPSA or the power source voltage VDD input through the current sensing unit 210 to the cell array 230. The transfer unit 220 may include at least one switching element. For example, the transfer unit 220 includes a diode to provide a forward signal path from the current sensing unit 210 to the cell array 230. Furthermore, the transfer unit 220 may include a transistor having a drain connected with the current sensing unit 210 and a source connected with the cell array 230. A switching control signal may be input to a gate of the transistor.

The cell array 230 may include at least one unit cell UC. One unit cell UC is shown in FIG. 5 as a representative example. The unit cell UC may include a phase-change resistor PCR and a switching element. For example, the switching element may be a diode D. The diode D can make a forward signal path from a bit line BL to a word line WL.

The second reference voltage generating unit 250 generates and supplies the second reference voltage VSAREF to the sense amplifier 240. The sense amplifier 240 compares the sensing voltage SAI output from the current sensing unit 210 with the second reference voltage VSARFE to output the sensing data SOB. For example, if the sensing voltage SAI is greater than the second reference voltage VSARFE, the sense amplifier 240 outputs the sensing data SOB corresponding to the data of logical "0". On the other hand, if the sensing voltage SAI is lower than the second reference voltage VSARFE, the sense amplifier 240 outputs the sensing data SOB corresponding to the data of logical "1".

Figure 6:
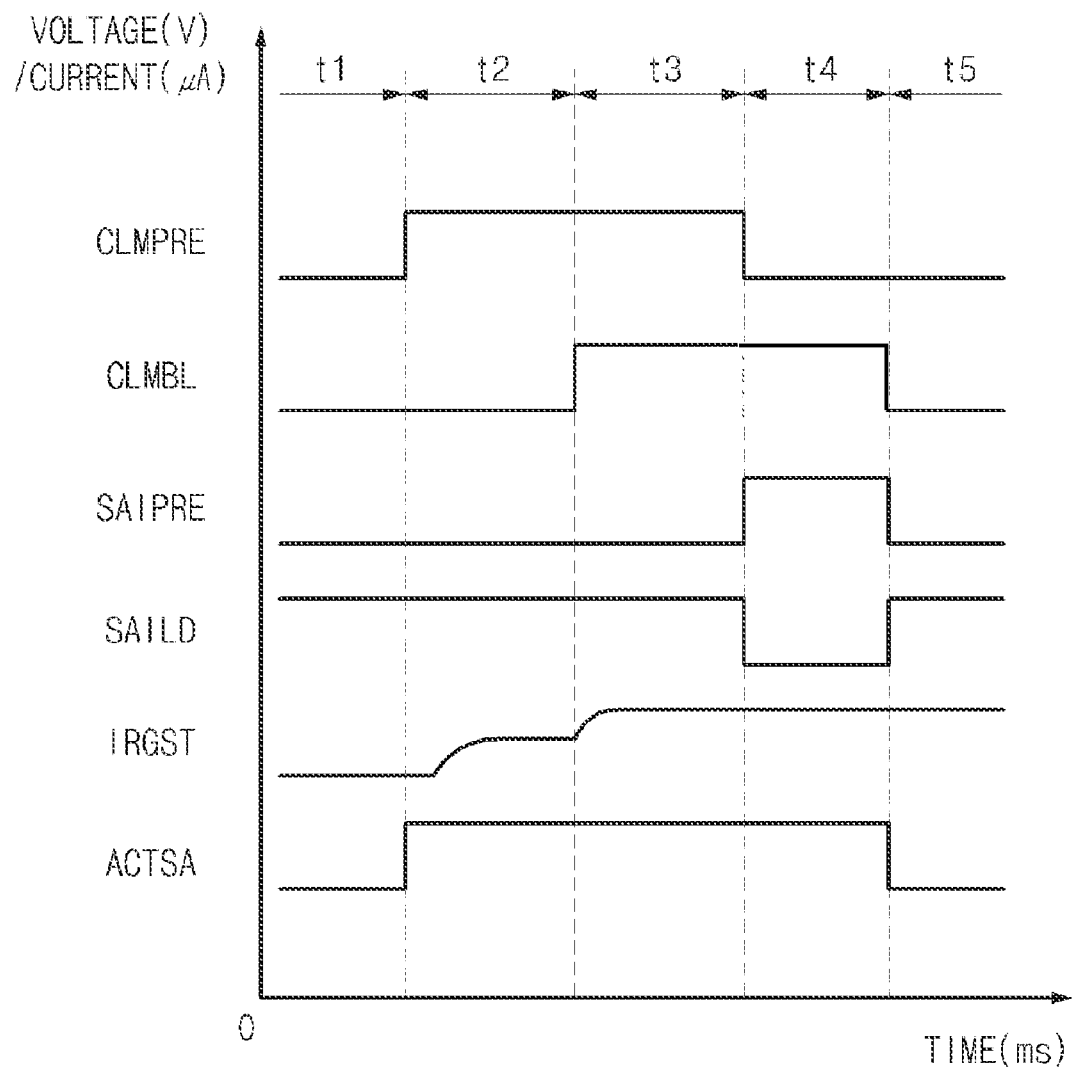
FIG. 6 is a timing diagram illustrating an operation of the sensing circuit shown in FIG. 5.

FIG. 6 is a timing diagram illustrating an operation of the sensing circuit 200 shown in FIG. 5.

Referring to FIG. 6, during a time section t1, the first clamping control signal CLMPRE having a low level, the second clamping control signal CLMBL having a low level, the current precharge signal SAIPRE having a low level, and the current drive signal SAILD having a high level are input to the sensing circuit 200. In this case, the first PMOS transistor P1 is turned-off, the second PMOS transistor P2 is turned-on, the third PMOS transistor P3 is turned-on, the first NMOS transistor N1 is turned-off, and the second NMOS transistor N2 is turned-off.

Therefore, the power source voltage VPPSA supplied from the power generation circuit 100 is driven by the second PMOS transistor P2 such that the sensing voltage SAI is precharged with the power source voltage VPPSA. That is, the first NMOS transistor N1 is turned-off not to supply the power source voltage VPPSA to the cell array 230. Furthermore, although the third PMOS transistor P3 is turned-on, the second NMOS transistor N2 is turned-off, the power source voltage VDD is not supplied to the cell array 230. In this case, a phase-change resistance current IRGST flowing through the unit cell UC included in the cell array 230 becomes zero (i.e., 0 A).

During a time section t2, the first clamping control signal CLMPRE input to the sensing circuit 200 transitions from the low level to a high level. Accordingly, the second NMOS transistor N2 is turned-on. When the third PMOS transistor P3 and the second NMOS transistor N2 are turned-on, the power source voltage VDD is supplied to the cell array 230. In this case, the phase-change resistance current IRGST flows through the unit cell UC included in the cell array 230 by the power source voltage VDD.

During a time section t3, the second clamping control signal CLMBL input to the sensing circuit 200 transitions from the low level to a high level. Accordingly, the third PMOS transistor P3 is turned-off, although the first NMOS transistor N1 is turned-on. Because the third PMOS transistor P3 is turned-off, the power source voltage VDD is disconnected from the cell array 230. Meanwhile, because the first NMOS transistor N1 is turned-on, the power source voltage VPPSA driven by the second PMOS transistor P2 is supplied to the cell array 230. In this case, the phase-change resistance current IRGST flows through the unit cell UC included in the cell array 230 by the power source voltage VPPSA.

For example, in this case, assuming that a level of the power source voltage VPPSA is higher than that of the power source voltage VDD, the phase-change resistance current IRGST increases during the time section t3 in comparison with during the time section t2.

During a time section t4, the first clamping control signal CLMPRE and the current drive signal SAILD input to the sensing circuit 200 transition from the high level to the low level. Meanwhile, the current precharge signal SAIPRE transitions from the low level to the high level, and the second clamping control signal CLMBL maintains the high level. Accordingly, the second NMOS transistor N2 and the second PMOS transistor P2 are turned-off, but the first PMOS transistor P1 is turned-on.

In this case, because both the third PMOS transistor P3 and the second NMOS transistor N2 are turned-off, the power source voltage VDD is not supplied to the cell array 230. In the meantime, while the second PMOS transistor P2 is turned-off, the first PMOS transistor P1 is turned-on, and the first NMOS transistor N1 is still turned-on, the power source voltage VPPSA can be driven by the first PMOS transistor P1 to be supplied to the cell array 230.

In this case, the phase-change resistance current IRGST flows through the unit cell UC included in the cell array 230 by the power source voltage VPPSA. For example, assuming that the driving performance of the first PMOS transistor P1 and the second PMOS transistor P2 are the same, during the time sections t3 and t4, the same phase-change resistance current IRGST flows through the unit cell UC.

During a time section t5, the second clamping control signal CLMBL and the current precharge signal SAIPRE input to the sensing circuit 200 transition from the high level to the low level. Meanwhile, the current drive signal SAILD transitions from the low level to the high level, and the first claiming control signal CLMPRE maintains the low level. Accordingly, while the first NMOS transistor N1 and the first PMOS transistor P1 are turned-off, the second PMOS transistor P2 is turned-on.

In this case, because the first NMOS transistor N1 is turned-off, the power source voltage VPPSA is not supplied from the current sensing unit 210 to the cell array 230 anymore. Since the third PMOS transistor P3 is turned-on but the second NMOS transistor N2 is turned-off, the power source voltage VDD is not supplied from the current sensing unit 210 to the cell array 230. Namely, during the time section t5, because both of the power source voltages VPPSA and VDD are not supplied to the cell array 230, the phase-change resistance current IRGST does not flow to the phase-change resistor PCR.

From the above description, it may be understood that the power source voltage VPPSA or VDD is supplied to the cell array 230 during the time section t2 to the time section t4. In other words, during the time section t2 to the time section t4, the power source voltage VPPSA or VDD is supplied to allow the phase-change resistance current IRGST to flow through the unit cell UC. Since, during the time section t2 to the time section t4, the phase-change resistance current IRGST flows to the phase-change resistor PCR to perform the sensing operation, the time sections can be defined as a "sensing period".

When the phase-change resistance current IRGST flows to the phase-change resistor PCR during the sensing period, the sensing voltage SAI corresponding to a resistance value of the phase-change resistor PCR is output to the output terminal of the current sensing unit 210.

The sense amplifier 240 compares the sensing voltage SAI with the second reference voltage VSAREF from the second reference voltage generating unit 250 to output the sensing data SOB.

Furthermore, the power generation circuit 100 may supply the power source voltage VPPSA to the sensing circuit 200 during only the sensing period. Although the power generation circuit 100 supplies the power source voltage VPPSA to the sensing circuit 200 during the remaining sections except for the sensing period, the sensing circuit 200 does not use the power source voltage VPPSA. Accordingly, the disconnection of the power source voltage VPPSA during the remaining periods may reduce the power consumption.

In the phase-change memory device according to this embodiment of the present invention, a signal enabled during the sensing period is defined as the activation signal ACTSA. For example, the activation signal ACTSA may be generated to be enabled at the timing where the first clamp control signal CLMPRE transitions from the low level to the high level, and to be disabled at the timing where the second clamp control signal CLMBL transitions from the high level to the low level.

Figure 7:
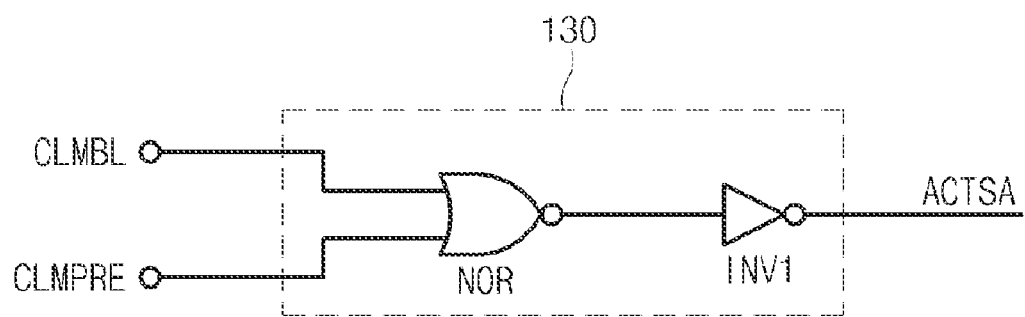
FIG. 7 is a circuit diagram illustrating an activation control unit included in a power generation circuit of the phase-change memory device according to an embodiment of the present invention.

FIG. 7 is a circuit diagram illustrating the activation control unit 130 included in the power generation circuit 100 of the phase-change memory device according to an embodiment of the present invention.

Referring to FIG. 7, the activation control unit 130 outputs the activation signal ACTSA to the power sensing unit 140. The power generation circuit 100 controls the generation of the power source voltage VPPSA according to the active signal ACTSA.

For example, if the active signal ACTSA is input to the power sensing unit 140 in a disabled state, the power sensing unit 140 does not generate the power control signal SADET. When the power control signal SADET is not generated, the power generating unit 150 does not generate the power source voltage VPPSA. As a result, the power generation circuit 100 can control the power source voltage VPPSA not to be supplied to the sensing circuit 200.

The activation control unit 130 may combine various signals in the phase-change memory device to generate the activation signal ACTSA. For example, the activation control unit 130 may use the first clamping control signal CLMPRE and the second clamping control signal CLMBL to generate the activation signal ACTSA. The activation control unit 130 may include a NOR gate NOR and an inverter INV1. The NOR gate NOR performs a logical NOR operation on the first clamping control signal CLMPRE and the second clamping control signal CLMBL. The inverter INV1 inverts an output signal of the NOR gate NOR to output the activation signal ACTSA.

Referring back to FIG. 5, during the time section t1, the first clamping control signal CLMPRE having the low level and the second clamping control signal CLMBL having the low level are input to the NOR gate NOR which in turn performs the logical NOR operation on the signals CLMPRE and CLMBL to output a high-level signal. The inverter INV1 inverts the high-level signal from the NOR gate NOR to output a low-level signal. As a result, the activation signal ACTSA is generated to have a low level.

During the time section t2, the first clamping control signal CLMPRE having the high level and the second clamping control signal CLMBL having the low level are input to the NOR gate NOR, and the NOR gate NOR performs the logical NOR operation on the signals CLMPRE and CLMBL to output a low-level signal. The inverter INV1 inverts the low-level signal from the NOR gate NOR to output a high-level signal. As a result, the activation signal ACTSA is generated to have a high level.

During the time section t3, the first clamping control signal CLMPRE having the high level and the second clamping control signal CLMBL having the high level are input to the NOR gate NOR that in turn performs the logical NOR operation on the signals CLMPRE and CLMBL to output a low-level signal. The inverter INV1 inverts the low-level signal from the NOR gate NOR to output a high-level signal. As a result, the activation signal ACTSA is generated to have a high level.

During the time section t4, the first clamping control signal CLMPRE having the low level and the second clamping control signal CLMBL having the high level are input to the NOR gate NOR, and the NOR gate NOR performs the logical NOR operation on the signals CLMPRE and CLMBL to output a low-level signal. The inverter INV1 inverts the low-level signal from the NOR gate NOR to output a high-level signal. As a result, the activation signal ACTSA is generated to have a high level.

During the time section t5, the first clamping control signal CLMPRE having the low level and the second clamping control signal CLMBL having the low level are input to the NOR gate NOR, and then the NOR gate NOR performs the logical NOR operation on the signals CLMPRE and CLMBL to output a high-level signal. The inverter INV1 inverts the high-level signal from the NOR gate NOR to output a low-level signal. As a result, the activation signal ACTSA is generated to have a low level.

As described above, the activation control unit 130 may generate the active signal ACTSA enabled during the sensing period (e.g., time sections t2 to t4) based on the first clamping control signal CLMPRE and the second clamping control signal CLMBL.

Figure 8:
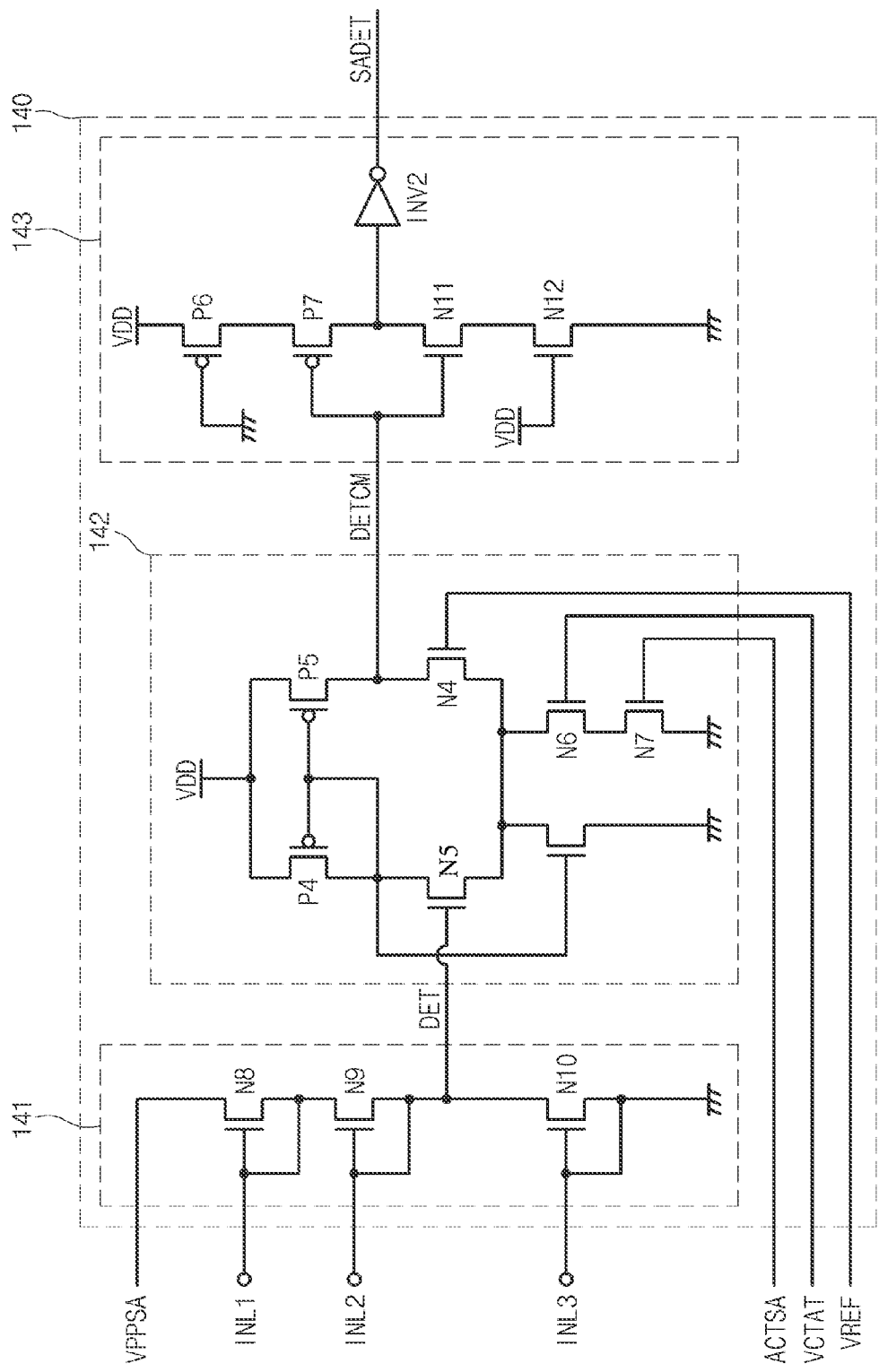
FIG. 8 is a circuit diagram illustrating a power sensing unit included in the power generation circuit of the phase-change memory device according to an embodiment of the present invention.

FIG. 8 is a circuit diagram illustrating the power sensing unit 140 included in the power generation circuit 100 of the phase-change memory device according to an embodiment of the present invention.

Referring to FIG. 8, the power sensing unit 140 includes a comparison voltage providing part 141, a differential amplifying part 142, and a control signal output part 143.

The power sensing unit 140 receives the power source voltage VPPSA output from the power generating unit 150, input control signals INL1~INL3, the activation signal ACTSA, the temperature compensation control voltage VCTAT, and the first reference voltage VREF.

The comparison voltage providing part 141 may include a voltage divider having at least one MOS transistor. For example, although NMOS transistors N8~N10 are shown in FIG. 8, PMOS transistors can be used and the number of the NMOS transistors can be changed.

Referring to FIG. 8, the comparison voltage providing part 141 includes the NMOS transistors N8~N10. The NMOS transistors N8~N10 are serially connected with each other. The control signals INL1~INL3 are input to gates of the NMOS transistors N8~N10, respectively.

The comparison voltage providing part 141 determines a level of an output comparison voltage DET according to voltage levels of the control signals INL1~INL3 input to the gates of the NMOS transistors N8~N10, respectively. For example, if the voltage levels of the first and second input control signals INL1 and INL2 are high, because the power source voltage VPPSA is sufficiently supplied, the level of the output comparison voltage DET becomes high. Meanwhile, if the voltage level of the third input control signal INL3 is high, because electric current flows to a ground voltage terminal, the level of the output comparison voltage DET becomes low.

The differential amplifying part 142 receives and differentially amplifies the comparison voltage DET provided from the comparison voltage providing part 141 and the first reference voltage VREF provided from the first reference voltage generating unit 120. Furthermore, the differential amplifying part 142 receives the activation signal ACTSA and the temperature compensation control voltage VCTAT to control the operation timing thereof.

In accordance with this embodiment, the differential amplifying part 142 includes PMOS transistors P4 and P5 and NMOS transistors N3~N7. The comparison voltage DET and the first reference voltage VREF are respectively input to gates of the NMOS transistors N3 and N4. The temperature compensation control voltage VCTAT is input to a gate of the NMOS transistor N6. The activation signal ACTSA is input to a gate of the NMOS transistor N7.

In the differential amplifying part 142, sources of the NMOS transistors N3 and N4 are connected to a drain of the NMOS transistor N6. A source of the NMOS transistor N6 is connected with a drain of the NMOS transistor N7. A source of the NMOS transistor N7 is connected with the ground voltage terminal. The NMOS transistor N5 includes a drain connected to the drain of the NMOS transistor N6, a gate connected to gates of the PMOS transistors P4 and P5, and a source connected to the ground voltage terminal.

A voltage level of a sensing signal DETCM output to an output terminal of the differential amplifying part 142 is controlled according to a voltage level of the temperature compensation control voltage VCTAT. For example, if the voltage level of the temperature compensation control voltage VCTAT becomes low, the voltage level of the sensing signal DETCM may be high.

The voltage level of the sensing signal DETCM output to the output terminal of the differential amplifying part 142 is controlled according to the voltage level of the activation signal ACTSA. For example, if the activation signal ACTSA is enabled to turn-on the NMOS transistor N7, the differential amplifying part 142 performs a differential amplification operation to output the sensing signal DETCM. Conversely, if the activation signal ACTSA is disabled to turn-off the NMOS transistor N7, the differential amplifying part 142 stops the differential amplification operation. If the differential amplification operation is not performed, because the sensing signal DETCM is output to have a zero (i.e., 0 V) voltage, both the power control signal SADET and the power source voltage VPPSA are not produced.

The control signal output part 143 drives the sensing signal DETCM to output the power control signal SADET. The control signal output part 143 may include at least one NMOS transistor. For example, referring to FIG. 8, the control signal output part 143 may include PMOS transistors P6 and P7, and NMOS transistors N11 and N12. The control signal output part 143 may further include an inverter INV2.

The PMOS transistor P6 has a source connected with a supply terminal of the power source voltage VDD, a gate connected with the ground voltage terminal, and a drain connected with a source of the PMOS transistor P7.

Since the gate of the PMOS transistor P6 is connected with the ground voltage terminal, the PMOS transistor P6 drives the power source voltage VDD to the source of the PMOS transistor P7.

The power source voltage VDD driven by the PMOS transistor P6 is supplied to the source of the PMOS transistor P7, and the sensing signal DETCM is input to a gate of the PMOS transistor P7. A drain of the PMOS transistor P7 is connected with a drain of the NMOS transistor N11.

The NMOS transistor N12 has a drain connected with a source of the NMOS transistor N11, a gated supplied with the power source voltage VDD, and a source connected with the ground voltage terminal.

The NMOS transistor N12 is driven by the power source voltage VDD supplied to its gate to flow an electric current from its drain to its source.

If the sensing signal DETCM having a high level is input to the control signal output part 143, the PMOS transistor P7 is turned-off but the NMOS transistor N11 is turned-on. In this case, because an electric current flows to the ground voltage terminal through the NMOS transistors N11 and N12, the drain of the NMOS transistor N11 is down to a ground voltage, namely, a low level. The inverter INV2 inverts the low-level signal from the NMOS transistor N11 to output the power control signal SADET having a high level.

In the meantime, if the sensing signal DETCM having a low level is input to the control signal output part 143, the PMOS transistor P7 is turned-on but the NMOS transistor N11 is turned-off. In this case, because the power source voltage VDD is supplied through the PMOS transistors P6 and P7, the drain of the PMOS transistor N7 is up to a high level. The inverter INV2 inverts the high-level signal from the PMOS transistor P7 to output the power control signal SADET having a low level. Then, the power generating unit 150 generates the power source voltage VPPSA according to the power control signal SADET.

Figure 9:
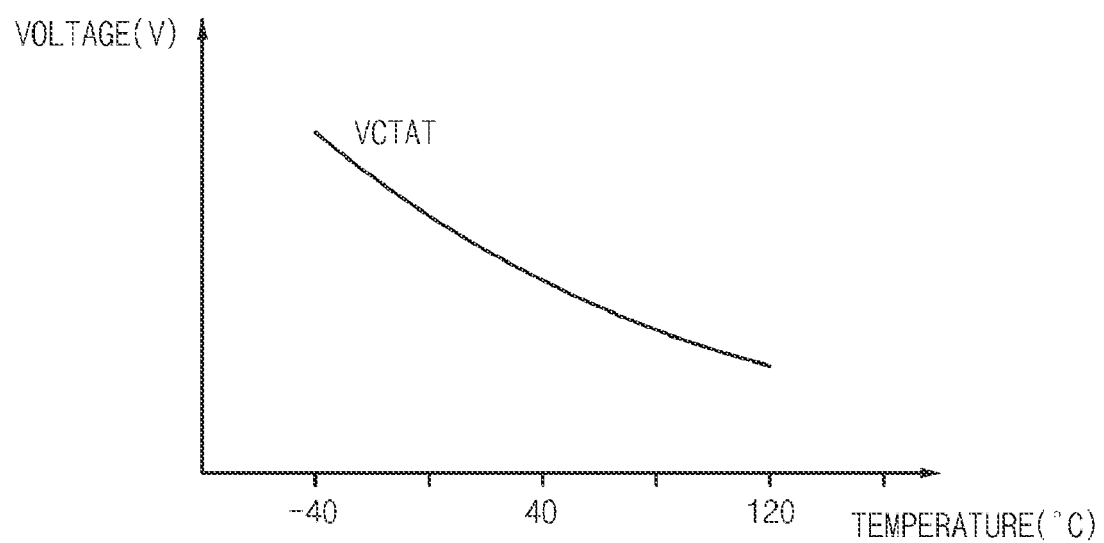
FIG. 9 is a graph illustrating a temperature compensation control voltage of the phase-change memory device according to an embodiment of the present invention.

FIG. 9 is a graph illustrating the temperature compensation control voltage VCTAT of the phase-change memory device according to an embodiment of the present invention. Referring to FIG. 9, the temperature variation compensation voltage generating unit 110 of the phase-change memory device generates the temperature compensation control voltage VCTAT whose level is reduced according to the increase of a temperature. Various circuits capable of generating a control voltage whose level is reduced according to the increase of a temperature can be used as the temperature variation compensation voltage generating unit 110 of the phase-change memory device according to embodiments of the present invention.

Figure 10:
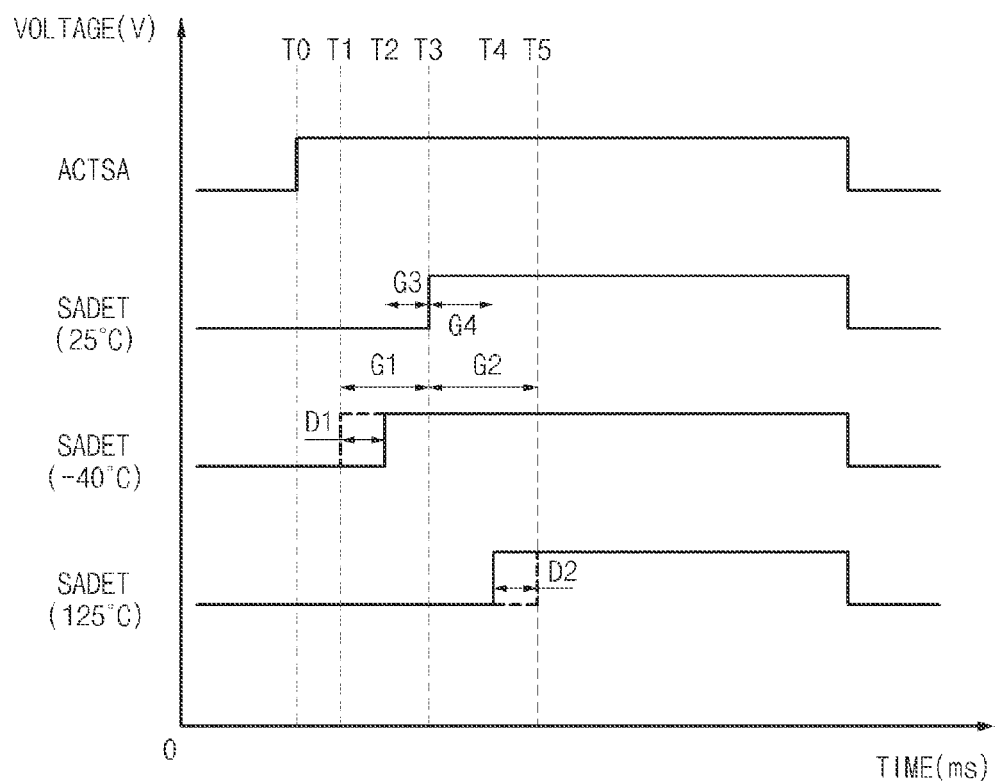
FIG. 10 is a timing diagram illustrating variation of a power control signal according to a temperature compensation control voltage in the phase-change memory device according to an embodiment of the present invention.

FIG. 10 is a timing diagram illustrating variation of the power control signal SADET according to the temperature compensation control voltage VCTAT in the phase-change memory device according to an embodiment of the present invention. FIG. 10 shows the timing diagram to compare a case of generating the power control signal SADET using the temperature compensation control voltage VCTAT according to an embodiment of the present invention with a case of generating the power control signal SADET without using the temperature compensation control voltage VCTAT according to the related art.

Referring to FIG. 10, if the activation signal ACTSA is enabled at a time T0, the power sensing unit 140 starts an amplification operation.

If the temperature compensation control voltage VCTAT is not used according to the related art, the power sensing unit 140 of the phase-change memory device controls the activation timing of the power control signal SADET as follows.

(1) At 25° C., the power sensing unit 140 of the phase-change memory device controls the power control signal SADET to be enabled at a time T3.

(2) At −40° C., the power sensing unit 140 controls the power control signal SADET to be enabled at a time T1 by G1 rapider than the case of 25° C.

(3) At 125° C., the power sensing unit 140 controls the power control signal SADET to be enabled at a time T5 by G2 later than the case of 25° C.

Theoretically, the temperature compensation control voltage VCTAT is preferably activated at a constant time regardless of the temperature variation. For example, the temperature compensation control voltage VCTAT is preferably activated at a time T3 at all temperatures of −40° C., 25° C., and 125° C.

If the temperature compensation control voltage VCTAT according to an embodiment of the present invention is used, referring back to FIG. 8, in the differential amplifying part 142, as a temperature increases, a level of the temperature compensation control voltage VCTAT input to the gate of the NMOS transistor N6 becomes lower. In this case, as the temperature increases, a voltage level of the common source of the NMOS transistors N3 and N4 is slowly lowered.

Namely, the phase-change memory device according to an embodiment of the present invention can control the power control signal SADET to be independent of a temperature increase, thereby minimizing amplitude variation of the power control signal SADET with respect to a temperature variation.

The power sensing unit 140 of the phase-change memory device according to an embodiment of the present invention controls the activation timing of the power control signal SADET as follows.

(1) At 25° C., the power sensing unit 140 of the phase-change memory device controls the power control signal SADET to be enabled at the time T3. That is, there is no difference between the activation timing of the power control signal by the conventional phase-change memory device and that by the phase-change memory device according to an embodiment of the present invention at a room temperature.

(2) At −40° C., the power sensing unit 140 of the phase-change memory device controls the power control signal SADET to be enabled at a time T2 which is a time G3 faster than the case of 25° C.

(3) At 125° C., the power sensing unit 140 of the phase-change memory device controls the power control signal SADET to be enabled at a time T4 which is a time G4 later than the case of 25° C.

As a result, the phase-change memory device according to an embodiment of the present invention may make the activation timing of the power control signal SADET delayed by D1 at −40° C. and faster by D2 at 125° C. in comparison with the related art.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A phase-change memory device, comprising:
   a cell array including one or more unit cells;
   a current sensing unit configured to sense data stored in a unit cells; and
   a power generation circuit configured to generate and supply a power source voltage to the current sensing unit, the power generation circuit being configured to be activated to generate the power source voltage while the current sensing unit is performing a sensing operation,
   wherein the current sensing unit is configured to drive the power source voltage to produce a sensing current, and
   wherein the power generation circuit controls an activation timing of the power source voltage according to temperature variation.

2. The phase-change memory device of claim 1, wherein the power generation circuit comprises:
   a power sensing unit configured to sense the power source voltage to generate a power control signal; and
   a power generating unit configured to generate the power source voltage according to the power control signal.

3. The phase-change memory device of claim 2, wherein the power generation circuit further comprises a temperature variation compensation voltage generating unit configured to generate a temperature variation compensation voltage having a level that varies according to temperature variation.

4. The phase-change memory device of claim 3, wherein the power generating unit controls the activation timing of the power control signal according to the temperature variation compensation voltage.

5. The phase-change memory device of claim 4, wherein the temperature variation compensation voltage generating unit generates the temperature variation compensation voltage having a level that decreases according to an increase in a temperature.

6. The phase-change memory device of claim 3, wherein the power generation circuit further comprises a first reference voltage generating unit configured to generate a first reference voltage.

7. The phase-change memory device of claim 6, wherein the power sensing unit is configured to differentially amplify the first reference voltage and the power source voltage to produce the power control signal.

8. The phase-change memory device of claim 7, wherein the power sensing unit comprises:
   a voltage divider configured to divide a voltage of the power source voltage;
   an amplifier configured to differentially amplify the divided voltage of the power source voltage and the first reference voltage to generate a sensing signal; and
   an output driver configured to drive the sensing signal to generate the power control signal.

9. The phase-change memory device of claim 8, wherein the voltage divider comprises a plurality of resistance elements serially connected between an input terminal of the power source voltage and a ground voltage terminal.

10. The phase-change memory device of claim 9, wherein each of the plurality of resistance elements is a MOS transistor, and the resistance elements are configured to control voltage division of the power source voltage by using a control signal input to a gate of the MOS transistor.

11. The phase-change memory device of claim 1, wherein the power generation circuit further comprises an activation control unit configured to generate an activation signal enabled while the current sensing unit is performing the sensing operation.

12. The phase-change memory device of claim 11, wherein the unit cell comprises a phase-change resistor.

13. The phase-change memory device of claim 12, wherein the current sensing unit supplies the sensing current to the phase-change resistor to output a sensing voltage.

14. The phase-change memory device of claim 13, wherein the current sensing unit starts supply of the sensing current to the phase-change resistor according to a first clamping control signal.

15. The phase-change memory device of claim 14, wherein the current sensing unit completes the supply of the sensing current to the phase-change resistor according to a second clamping control signal.

16. The phase-change memory device of claim 15, wherein the activation control unit generates the activation signal according to the first clamping control signal and the second clamping control signal.

17. The phase-change memory device of claim 16, wherein the activation signal is enabled when starting the supply of the sensing current according to the first clamping control signal and disabled when completing the supply of the sensing current according to the second clamping control signal.

18. The phase-change memory device of claim 2, wherein the power generation circuit further comprises a charge storage element coupled to an output terminal of the power generation unit to store the power source voltage.

19. The phase-change memory device of claim 12, wherein the unit cell further comprises a switching element.

20. The phase-change memory device of claim 16, wherein the activation control unit comprises:
 a logic element configured to logically combine the first clamping control signal and the second clamping control signal; and
 a driver configured to drive an output of the logic element.

21. The phase-change memory device of claim 20, wherein the logic element comprises a NOR gate.

22. The phase-change memory device of claim 20, wherein the driver comprises an inverter.

23. The phase-change memory device of claim 13, further comprising a second reference voltage generating unit configured to generate a second reference voltage.

24. The phase-change memory device of claim 14, further comprising a sense amplifier configured to compare the sensing voltage with the second reference voltage to output sensing data.

* * * * *